US010364141B2

(12) United States Patent
Wang et al.

(10) Patent No.: US 10,364,141 B2
(45) Date of Patent: Jul. 30, 2019

(54) BLOCK COPOLYMER NANOSTRUCTURES FORMED BY DISTURBED SELF-ASSEMBLY AND USES THEREOF

(71) Applicant: WASHINGTON STATE UNIVERSITY, Pullman, WA (US)

(72) Inventors: Yu Wang, Pullman, WA (US); Wei-hong Zhong, Pullman, WA (US)

(73) Assignee: WASHINGTON STATE UNIVERSITY, Pullman, WA (US)

(*) Notice: Subject to any disclaimer, the term of this patent is extended or adjusted under 35 U.S.C. 154(b) by 308 days.

(21) Appl. No.: 15/107,647

(22) PCT Filed: Dec. 18, 2014

(86) PCT No.: PCT/US2014/071140
§ 371 (c)(1),
(2) Date: Jun. 23, 2016

(87) PCT Pub. No.: WO2015/100126
PCT Pub. Date: Jul. 2, 2015

(65) Prior Publication Data
US 2016/0332869 A1    Nov. 17, 2016

Related U.S. Application Data

(60) Provisional application No. 61/920,455, filed on Dec. 23, 2013.

(51) Int. Cl.
*B81C 1/00* (2006.01)
*C08F 299/04* (2006.01)
*C08G 81/00* (2006.01)
*B82Y 40/00* (2011.01)

(52) U.S. Cl.
CPC ...... *B81C 1/00007* (2013.01); *B81C 1/00031* (2013.01); *C08F 299/0492* (2013.01); *C08G 81/00* (2013.01); *B81C 2201/0149* (2013.01); *B82Y 40/00* (2013.01)

(58) Field of Classification Search
None
See application file for complete search history.

(56) References Cited

U.S. PATENT DOCUMENTS

| 6,201,072 B1 * | 3/2001 | Rathi | A61K 9/0024 424/425 |
| 2008/0033106 A1 * | 2/2008 | Koroskenyi | C08F 293/005 524/801 |
| 2009/0020924 A1 * | 1/2009 | Lin | B81C 1/00031 264/605 |
| 2010/0120252 A1 * | 5/2010 | Kim | B81C 1/00031 438/700 |

(Continued)

*Primary Examiner* — Michael P. Rodriguez
(74) *Attorney, Agent, or Firm* — W & C IP

(57) ABSTRACT

Block copolymer nanostructures such as nanosheets, nanoribbons, and nanotubes, are provided. The nanotructures are formed by the self-assembly of block copolymers during evaporation of solvent from a sol that has been "disturbed", either i) internally by the introduction of relief (e.g. curvature) and/or the inclusion of nanoparticles in the sol; or ii) externally, e.g. by physical deformation of a semi-solid form of the sol, or a combination of internal and external disturbance. The nanostructures have uses in, for example, energy devices, electronics, sensors and drug delivery applications.

5 Claims, 9 Drawing Sheets

(56) References Cited

U.S. PATENT DOCUMENTS

2011/0081526 A1    4/2011  Mirkin et al.
2011/0130478 A1*  6/2011  Warren ..................... B22F 9/02
                                                    521/153

* cited by examiner

BLOCK COPOLYMER NANOSTRUCTURES FORMED BY DISTURBED SELF-ASSEMBLY AND USES THEREOF

BACKGROUND OF THE INVENTION

Field of the Invention

The invention generally relates to nanostructures, including densely assembled block copolymer nanosheets (BCNSs), and methods of making and using the nanostructures. In particular, the methods involve disturbance from nanoparticles (internal disturbance) and/or external deformations/forces to the self-assembly of block copolymer sol induced by evaporating liquid from the system, thereby forming nanostructures, for example, a high density structure comprising a plurality of densely packed BCNSs.

Background of the Invention

In nature, numerous highly "smart" nano-materials such as proteins and DNA are constructed through self-assembly of building blocks that are driven by well-controlled intermolecular and/or intramolecular interactions (hydrogen bonding, Van der Waals forces, electrostatic forces, etc.). By controlling the compositions/interactions in synthetic block copolymers (BCs), various self-assembly behaviors have also been found for nearly half a century and have become the most popular approach to artificial nanofabrication. One of the most intensively studied topics in the self-assembly of BCs is the variety of nano-structures formed by amphiphilic BCs in an aqueous solution. Depending on the concentration, amphiphilic BCs can assemble into micelles, spherical or cylindrical structures and also into periodic hexagonal, cubic, or lamellar mesophases. The micelles self-assembled in aqueous media have lent a strong impetus to bio-applications, including drug delivery and use in bioreactors and diagnostic tools, etc.

In parallel to the intensive studies on the self-assembly of BCs free of intervention (i.e. under constant concentration and at fixed temperatures, for example), self-assembly of compound systems under more complex conditions is also of great interest, e.g., with BCs and other components (nanoparticles, for example) and/or external intervention and evaporation, etc. These more complex systems have also been employed to fabricate nanomaterials. There are mainly two ways for the self-assembly of BCs to contribute to nanofabrication: the direct approach and the indirect approach. The direct approach includes nanofabrications in which the self-assembled BCs are the components of the nanomaterial. Various nanomaterials with well-defined structures have been made based on this approach, such as polymeric nano-objects (spheres, rods, fibers etc.), BC nanocomposites, and BC porous materials, among others. In the indirect approach, self-assembled BCs are used as a template and at least one of the blocks is removed in the final nanomaterial to obtain well-controlled nanostructures, e.g. comprising ordered nanopores.

Exploration of the potential of self-assembly of BCs in nanofabrications is ongoing and further exploration and development of new nanostructures is needed. It would be especially advantageous to have available cost-effective, environmental friendly, simple and scalable methods to prepare diverse types self-assembled nanostructures, e.g. high density nanostructures and/or nanostructures formed according to pre-determined patterns.

SUMMARY OF THE INVENTION

Other features and advantages of the present invention will be set forth in the description of invention that follows, and in part will be apparent from the description or may be learned by practice of the invention. The invention will be realized and attained by the compositions and methods particularly pointed out in the written description and claims hereof.

This disclosure provides a variety of straightforward yet robust techniques to form nanostructures from block copolymers. In one aspect, the methods involve forming a homogeneous suspension comprising block copolymer sol and other nanoparticles and placing the suspension into or onto a substrate so that an outer surface of the sol is exposed to ambient conditions. The self-assembly process of the block copolymer sol is disturbed by the nanoparticles inside the mixture ("internal" disturbance). Then, solvent (e.g. water or other liquid in the sol) is allowed to evaporate from the surface of the internally disturbed sol. Evaporation and drying of the surface causes spontaneous assembly of three-dimensional co-polymeric nanostructures (such as nanosheets, nanoribbons, nanotubes, etc.) Without being bound by theory, it is believed that curvature and resulting discontinuities in surface tension at the surface of the sol (e.g. created by the presence of nanoparticles and/or the shape of the substrate) may also contribute to and/or influence internal disturbance.

In a further aspect, the sol (with or without the inclusion of nanoparticles) is evaporated to a semi-solid state and then an "external" disturbance is introduced onto the surface of the semi-solid sol, e.g. by physically scoring or etching the surface. Then, further evaporation to dryness is allowed, causing spontaneous assembly of three-dimensional co-polymeric nanostructures at or near the site of physical disruption. Further description of the methods, the nanostructures formed by the methods and uses thereof are provided below.

It is an object of this invention to provide methods of making solid state block copolymer nanostructures. In some aspects, the methods comprise the steps of i) disturbing a top surface of a layer of a block copolymer sol; and ii) evaporating fluid from the block copolymer sol to form one or more solid state block copolymer nanostructures. In some aspects, the step of disturbing is performed by i) depositing the block copolymer sol on or adjacent to an uneven substrate or patterned substrate; and/or ii) including one or more types of nanoparticles in the block copolymer sol. In other aspects, the step of disturbing is performed by depositing the block copolymer sol on a hydrophilic surface, or by depositing the block copolymer sol on a hydrophobic surface. In some aspects, the step of disturbing is performed by physically modifying the block copolymer sol after depositing the block copolymer sol on a substrate and evaporating liquid from the block copolymer sol to form a semi-solid. In some aspects, the block copolymer is a bi-block copolymer or a tri-block copolymer. The bi-block copolymer is, for example, polyethylene-block-poly(ethylene glycol), polylactide-block-poly(ethylene glycol), or polystyrene-block-poly(acrylic acid). The tri-block copolymer is, for example, polylactide-block-poly(ethylene glycol)-block-polylactide or poly(ethylene glycol)-block-poly(propylene glycol)-block-poly(ethylene glycol). In some aspects, the block copolymer sol comprises at least one type of nanoparticle. In various aspects, the solid state block copolymer nanostructure is or includes one or more of a nanosheet, a nanoribbon and a nanotube.

In other aspects, the disclosure provides methods of patterning a block copolymer to yield solid state block copolymer nanosheets, The methods include steps of i) providing a layer of a block copolymer sol in semi-solid form, the layer having height, length and width dimensions, the length and width dimensions defining a patternable area; ii) physically disrupting selected portions of the patternable area which constitute less than all of the patternable area; and iii) evaporating fluid from the block copolymer sol to form one or more solid state block copolymer nanosheets. In some aspects, the step of physically disrupting is performed by contacting a top surface of the block copolymer sol with an object which extends to a point below the top surface. In some aspects, the block copolymer is a bi-block copolymer or a tri-block copolymer. The bi-block copolymer may be, for example, polyethylene-block-poly(ethylene glycol), polylactide-block-poly(ethylene glycol), or polystyrene-block-poly(acrylic acid); and the tri-block copolymer may be, for example, polylactide-block-poly(ethylene glycol)-block-polylactide or poly(ethylene glycol)-block-poly(propylene glycol)-block-poly(ethylene glycol). In further aspects, the block copolymer sol comprises at least one type of nanoparticle.

Additional aspects provide a block copolymer nanosheet having height, width and length dimensions, wherein the width dimension ranges from 1 to 100 nm. For example, the width dimension is about 60 nm in some aspects. In some aspects, the block copolymer is a bi-block copolymer or a tri-block copolymer. The bi-block copolymer may be, for example, polyethylene-block-poly(ethylene glycol), polylactide-block-poly(ethylene glycol), or polystyrene-block-poly(acrylic acid); and the tri-block copolymer may be, for example, polylactide-block-poly(ethylene glycol)-block-polylactide or poly(ethylene glycol)-block-poly(propylene glycol)-block-poly(ethylene glycol). In some aspects, the block copolymer is polyethylene-block-poly(ethylene glycol).

Further aspects of the disclosure include provision of a polymeric material having a base with a plurality of projecting block copolymer nanosheets, each of the plurality of block copolymer nanosheets having height, width and length dimensions, wherein the width dimension ranges from 1 to 100 nm. In some aspects, the block copolymer is a bi-block copolymer or a tri-block copolymer. The bi-block copolymer may be, for example, polyethylene-block-poly(ethylene glycol), polylactide-block-poly(ethylene glycol), or polystyrene-block-poly(acrylic acid); and the tri-block copolymer may be, for example, polylactide-block-poly(ethylene glycol)-block-polylactide or poly(ethylene glycol)-block-poly(propylene glycol)-block-poly(ethylene glycol). In some aspects, the block copolymer is polyethylene-block-poly(ethylene glycol).

DETAILED DESCRIPTION

Figure 1:
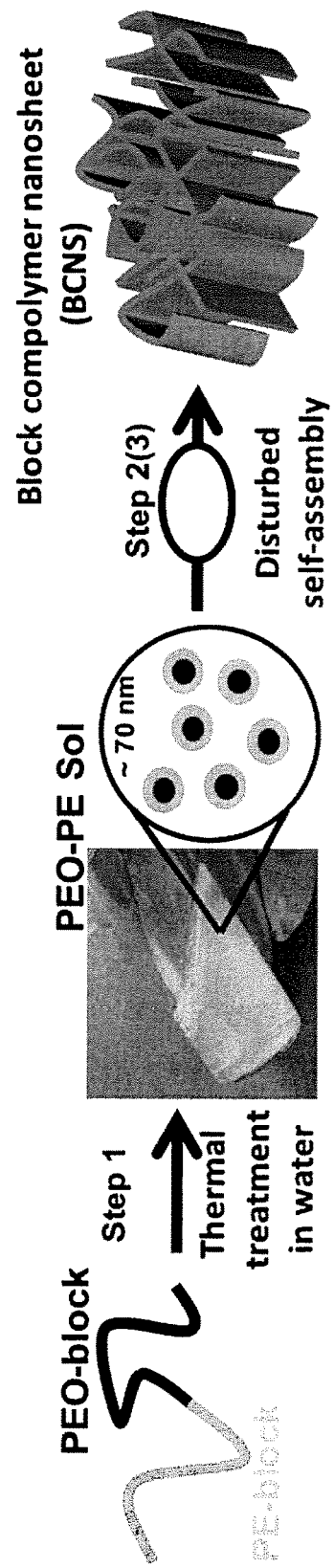
FIG. 1. Illustration of the fabrication of block copolymer nanosheet (BCNS) via disturbed self-assembly. In Step 1, PEO-PE copolymer is dispersed in hot water, and PEO-PE sol is obtained after a gel-sol transition. In step 2, the sol is either directly cast on a substrate for evaporation (the last step) or mixed with other nanoparticles (NPs) prior to the last step. By constructing a curved surface of the sol (or sol/NPs), the self-assembly of PEO-PE spherical micelles will proceed under the influence of surface tension and/or NPs, which finally gives rise to the nanosheet structures FIG. 2A-D. Effects of NPs on the growth of BCNS. Flat surface generated by casting on glass substrate: A, pure PEO-PE sol (3 wt %, the same below) and B, PEO-PE/MWCNT mixture (3 wt %, the same below). Curved surface generated by a droplet on superhydrophobic substrate: C, pure PEO-PE sol and D, PEO-PE/MWCNT mixture. Inserts are SEM images of the overview at low magnification of the dried droplets and the snapshots of the droplets with initial contact angles.

Provided herein are a variety of high-density, high-surface area nanostructures (NS), In some aspects, the nanostructures comprise a plurality of densely packed block copolymer nanosheets (BCNS). Also provided are methods of making and using the nanostructures. The production methods are advantageously performed using natural means (e.g. evaporation at ambient conditions) and thus little no or no external energy is required for manufacture, making the processes environmentally friendly. The resulting high-density, high-surface area solid state block co-polymer nanostructures are used in a wide range of applications.

Definitions

Sol: a homogeneous fluid colloidal system or mixture comprising one or more substances (solutes) dissolved or molecularly dispersed in a liquid dissolving medium (solvent).

Suspension is a heterogeneous mixture containing solid particles that are sufficiently large for sedimentation.

Liquid is one of the four fundamental states of matter (the others being solid, gas, and plasma), and is the only state with a definite volume but no fixed shape. A liquid is made up atoms and/or molecules held together by intermolecular bonds. Like a gas, a liquid is able to flow and take the shape of a container. Unlike a gas, a liquid does not disperse to fill every space of a container, and maintains a fairly constant density. A distinctive property of the liquid state is surface tension.

Surface tension: a physical property equal to the amount of force per unit area necessary to expand the surface of a liquid or sol. Surface tension forces are due to intermolecular forces between the liquid's or sol's molecules at its outer boundaries, e.g. at a surface such as a top or outer, external surface.

Methods of Making Nanostructured Material

Nanostructures described herein are fabricated by forming a homogeneous suspension comprising i) one or more block copolymer sol and, in some aspects, ii) one or more types of nanoparticles of interest (see below) in a suitable solvent. In some aspects, the solvent is aqueous and may be water and/or may include water. Other suitable solvents include but are not limited to: ethanol, acetonitrile, chroloform and so on. The block copolymers are dispersed in the solvent by any of several known methods (e.g. via one or more of ultrasonication, heat, stirring, etc.) in amounts suitable to form a sol, e.g. from about 0.1 wt % to about 50 wt %. The step of dispersing is generally carried out at a suitable temperature e.g. ranging from room temperature to about 100° C.

In one aspect, the sol generally includes one or more types of nanoparticles and the prepared suspension is deposited (e.g., cast) onto a substrate or support that, due to one or more features of its shape, or surface chemistry, or another property, and acting together with the nanoparticles, induces a disturbance to the self-assembly of the sol, e.g. an "internal" disturbance occurs. Internal disturbances prevent the sol from forming an even, planer and smooth top surface with a uniform surface tension. The one or more features of the support that contribute to such internal disturbances include geometric deviations from the planar, e.g. the features may be one or more edges, or one or more ridges or depressions, columns, channels, etc., or other irregularities in the portion of the substrate that is contacted by the sol upon deposition. Such morphological patterns are in contrast to and differ from patterns generated by the chemical patterning of sols. The present patterns (whether regular or irregular) involve creating varying topographical features (e.g. with height, depth, width, contours and relief) on the substrate surface. In this aspect, the features are not created by the deposition of chemicals or by lithography but are generated by forming the substrate per se into a desired shape, i.e. the patterns are integral to the substrate. Alternatively, the feature of the substrate may be a property such as hydrophobicity which tends to cause curvature of a deposited sol into a curved "droplet" that is e.g. substantially or largely spherical or spheroid (ellipsoid). The one or more features are sufficient to cause deformations in an exposed (e.g. upper or outer) surface of the sol and to cause a corresponding disruption of surface tension that would otherwise be substantially uniform across the exposed surface.

In other aspects, in order to initiate formation of nanostructures, a physical disturbance of the sol is introduced externally, e.g. by mechanically deforming the sol surface. In this aspect, the sol (which may or may not include nanoparticles) is first dried to a semi-solid consistency in which the concentration of solid components is from about 5 wt % to about 90 wt % (e.g. about 5, 10, 15, 20, 25, 30, 35, 40, 45, 50, 55, 60, 65, 70, 75, 80, 85 or 90%), e.g. by evaporation. The viscosity of the semi-solid is about 500 Pa·s.

The semi-solid retains some amount of fluid which is removed in a subsequent drying step to promote nanostructure formation, but the semi-solid is no longer a liquid and will retain deformations that are externally applied (unlike a liquid). A tool or implement is then used to score, etch, scratch, etc. or otherwise disrupt or "write" on the semi-solid surface. Depending on the desired use of the nanostructures, the etching may be random or non-random i.e. done according to a particular pattern or design. For example, a patterned grid may be used to "slice" into or penetrate the top surface of the semi-solid sol in "cookie cutter" fashion. Further evaporation (e.g. to dryness) is then allowed to take place and, as shown in the Examples section below, during evaporation densely packed nanosheets form along the disturbances created in the semi-solid surface.

In further aspects, the nanostructures are formed using a combination of internal and external disturbances, e.g. a sol that is internally disturbed to as to comprise curves at its surface e.g. by a geometric pattern on the substrate and/or by the inclusion of one or more types of nanoparticles, can be dried to a semi-solid, "written" on as described herein, and then further dried to completion.

In all aspects, exemplary substrates on which to deposit the sol include but are not limited to: conductive substrates (e.g. copper foil, conductive carbon paper etc.), non-conductive substrates (paper towel, glass, plastic film or fabrics, etc.) and other substrates with special surface properties or geometry, such as nanostructured substrates, hydrophobic (e.g. wax or lipid coated surfaces) or hydrophilic substrates, etc. Substrates may also comprise more than one type of surface, e.g. a plurality of types of surfaces at different locations on the substrate.

In some aspects, the steps of evaporating are carried out under ambient conditions, e.g. at room temperature (about 15-25° C.) and pressure (e.g. in open air). Evaporation to final dryness sufficient to form useful nanostructures typically requires approximately 10-24 hours under these conditions. Preparation of a semi-solid (for external disturbance aspects) typically requires about 24 hours of evaporation at e.g. about 50° C. (e.g. from about 40 to about 100° C.) followed by about 10 additional hours of evaporation at ambient temperature to achieve a level of dryness sufficient to form the nanostructures. It should be noted that evaporation assisted e.g. by low pressure, or exposure to a current of air, etc. is not excluded.

Copolymers which are employed as described herein are generally those with blocks which can crystallize e.g. amphiphilic copolymers. Exemplary suitable co-polymers include but are not limited to: bi-block copolymers (e.g. polyethylene-block-poly(ethylene glycol), polylactide-block-poly(ethylene glycol), polystyrene-block-poly(acrylic acid); tri-block copolymers (e.g. polylactide-block-poly(ethylene glycol)-block-polylactide, poly(ethylene glycol)-block-poly(propylene glycol)-block-poly(ethylene glycol); conductive block copolymers and others.

As described above, in internal disturbance aspects, the sol generally also includes one or more types of nanoparticles (NPs), e.g. to initiate or contribute to the generation of an internal disturbance, and or to modify the properties of the nanostructure. Exemplary NPs that may be used include but are not limited to: nanotubes such as multiwalled carbon nanotubes, carbon nanofibers, graphene, carbon black, nanoparticles of metals, wax particles, nano $SiO_2$, nano $TiO_2$, nano $MnO_2$, etc.

One or more additional substances or compounds may also be included in the sol that is used to generate the nanostructures, e.g. to modify the properties of the nanostructures. Exemplary additives include but are not limited to: various salts, ions, metal ions, dyes, drugs, antibodies, pesticides, toxins, functionalized copolymers or polymers, conductive nanofillers and other surfactants or copolymers.

Forms of the Nanostructures

Depending on the type of copolymers that are employed, the optional inclusion of other substances, and the conditions of the disturbance (internal or external or both), the final form of a nanostructure can vary greatly. Exemplary nanoscale forms include but are not limited to: sheets, ribbons, tubes (e.g. hollow tubes having nanoscale diameters), solid cylinders, hollow beads, etc. The structures may be regular or irregular in morphology, e.g. the sheets may have straight or ragged edges, and the cylinders may be straight, curved or bent, etc. In some aspects, what is formed is densely packed nanosheets or nanoribbons (e.g. block copolymer nanosheets or BCNS) or tubes which protrude from a base of the nanostructure. The nanostructures are generally not laminates.

In generally, the nanostructures have nanometer dimensions e.g. at least one of length, width height, wall thickness, diameter, etc. of the NS ranges from about 1 to about 100 nanometers, e.g. about 1, 5, 10, 15, 20, 25, 30, 35, 40, 45, 50, 55, 60, 65, 70, 75, 80, 85, 90, 95, or 100 nanometers. For example, a thickness or width of a nanostructure (e.g. a nanosheet or nanoribbon) generally falls within this range, and may be about 50 to 75 nm, or about 60 nm.

Applications of the Technology

The high surface area of the nanostructures, the simplicity of the fabrication as well as the sensitivity of the nanostructures to deformations all make disturbed self-assembly a very attractive nanotechnology for fabrication of nanomaterials for a wide variety of applications.

In one aspect, the materials are used as templates or supports for nanofabrication of nanostructures that conduct an electric current. For example, one can deposit conductive materials on the nanostructures or incorporate conductive materials into the nanostructures and the resulting material is used, e.g. as electrodes for batteries or supercapacitors, or in sensors or other electronic applications.

In other aspects, the nanostructures are used to delivery one or more agents of interest to an area of interest. This is accomplished, e.g. by associating the one or more agents of interest with a nanostructure, e.g. by depositing the agent(s) on surfaces of the nanostructures and/or incorporating the agent(s) into the nanostructures themselves by adding them to the sol from which the nanostructures are formed. The one or more agents are delivered to a location of choice, which may be any location or environment at or in which it is desired or appropriate for the agents to act. Exemplary target locations include sites within the human body, the exterior of plants or crops, at waste cleanup sites, etc. Exemplary substances (agents) that may be associated with the nanostructures in this manner include but are not limited to: drugs; pesticides; detectable agents such as radioactive, fluorescent, etc. agents; toxins (e.g. toxins that kill unwanted cells such as cancer cells and pathogens or pests); materials that absorb or adsorb unwanted odors or toxins, etc.;

For such applications, in some aspects, the active agents may be retained on or in the nanosheets in order to exert the desired action (e.g. absorption of an unwanted substance, electrical conduction, etc.), whereas in other aspects, the active agents may be released from the nanostructure, e.g. by dissolution into the surrounding milieu. In this aspect, which may apply e.g. to drugs, pesticides, etc., the agents then disperse into the surrounding environment to exert the desired effect.

The following examples serve to illustrate exemplary aspects of the disclosure but should not be interpreted so as to limit the technology in any way.

EXAMPLES

ABSTRACT: Nanofabrication is critical in many kinds of nanotechnology. To achieve controllable but simple nanofabrication is one of the central aspirations of many research communities. Here, for the first time, is reported the growth of nano-structures simply by introducing internal disturbances (adding nanoparticles and surface tension) and/or external disturbances (deformations) to the self-assembly of copolymers induced by evaporation. This disclosure provides a scalable, writable, cost-effective and environmentally friendly nanotechnology.

Example 1

Nanofabrication by self-assembly has been one of the most successful nanotechnologies. By controlling the compositions and interactions of nanoparticles (NPs),[1-5] surfactants, or synthetic block copolymers (BCs),[6-17] various self-assembly behaviors have been found. One of the most intensively studied topics in the self-assembly of BCs is the variety of nanostructures formed by amphiphilic block copolymers in an aqueous solution. Depending on the concentration, amphiphilic block copolymers can form micelles, or spherical and cylindrical structures, which can further assemble into periodic hexagonal, cubic, or lamellar mesophases.[18-25] These nanostructures are of great interest because of their significant potential applications. For example, micelles self-assembled in aqueous media have lent a strong impetus to bioapplications, including drug carriers, bioreactors, diagnostic tools, and so on.[26-28]

In parallel to the intensive studies on the self-assembly of block copolymers free of intervention (under constant concentration and fixed temperature, for example), self-assembly of compound systems (e.g., mixtures of block copolymers and NPs) under more complex conditions, such as external intervention[29-36] and controlled evaporation,[37-43] has also been of great interest. In this case, self-assembly of block copolymers has been employed as a tool for the fabrication of nanomaterials. There are two main ways in which the self-assembly of block copolymers can contribute to nanofabrication: through direct or indirect approaches. Direct approaches include nanofabrication processes in which the self-assembled block copolymers serve as a component of the nanomaterial. Various nanomaterials with well-defined structures have been demonstrated based on this approach, such as polymeric nano-objects (spheres, rods, fibers, etc.),[44-47] block copolymer nanocomposites,[48- block copolymer porous materials,[20,47,52-57] and so on. For indirect approaches, the block copolymers are used as a template, and at least one of the blocks will be removed from the final nanomaterials in order to obtain well-controlled nanostructures, such as ordered nanopores.[51,58]

In spite of the great successes so far, there is much room for growth in the area of nanofabrication assisted by BC self-assembly, as new nanostructures and cost-effective, environmentally friendly and scalable methods are developed. Here, we grow a new nanostructure, block copolymer nanosheet (BCNS), by harnessing the disturbance from NPs, surface tension, or deformations (strain), adding a new page to the body of knowledge on nanofabrication based on the self-assembly of block copolymers.

General Procedures for the Growth of Block Copolymer Nanosheet (BCNS). The general procedures for the fabrication of BCNS are summarized in FIG. 1. An amphiphilic block copolymer, PEO-PE, with equal weight fractions of hydrophobic block (PE-block) and hydrophilic block (PEO-block) has been employed. In the first step, PEO-PE was dispersed and heated in water at 95° C. to melt the PE-block. The melting point of PE-block is around 90° C. During thermal treatment, the PEO-PE/water mixture experiences a gel-sol transition. The high temperature PEO-PE sol is cooled to room temperature while stirring, and a light blue PEO-PE sol is obtained as shown in FIG. 1. The size of the PEO-PE particles in the sol is around 70 nm as determined by dynamic light scattering and SEM imaging. For the sample without the addition of other NPs, the PEO-PE sol is directly used in the next step (i.e., the last step in this case), the evaporation of solvent; for the samples with other NPs, a stable suspension of PEO-PE sol with NPs is prepared by ultrasonication with a fixed ratio between NPs and PEO-PE. In the last step, the PEO-PE sol or mixture of PEO-PE sol and NPs is cast on various substrates with different surface geometries and properties. The self-assembly of PEO-PE is induced by the evaporation of water and disturbed by NPs, curved surface (surface tension), which will be called disturbed self-assembly. Another method developed for the growth of BCNS is also referred as disturbed self-assembly since only an external disturbance (deformation) is employed after the evaporation of water. More details on these procedures can be found in Experimental Details.

Disturbed Self-Assembly by NPs and Curved Surface.

Figure 2:
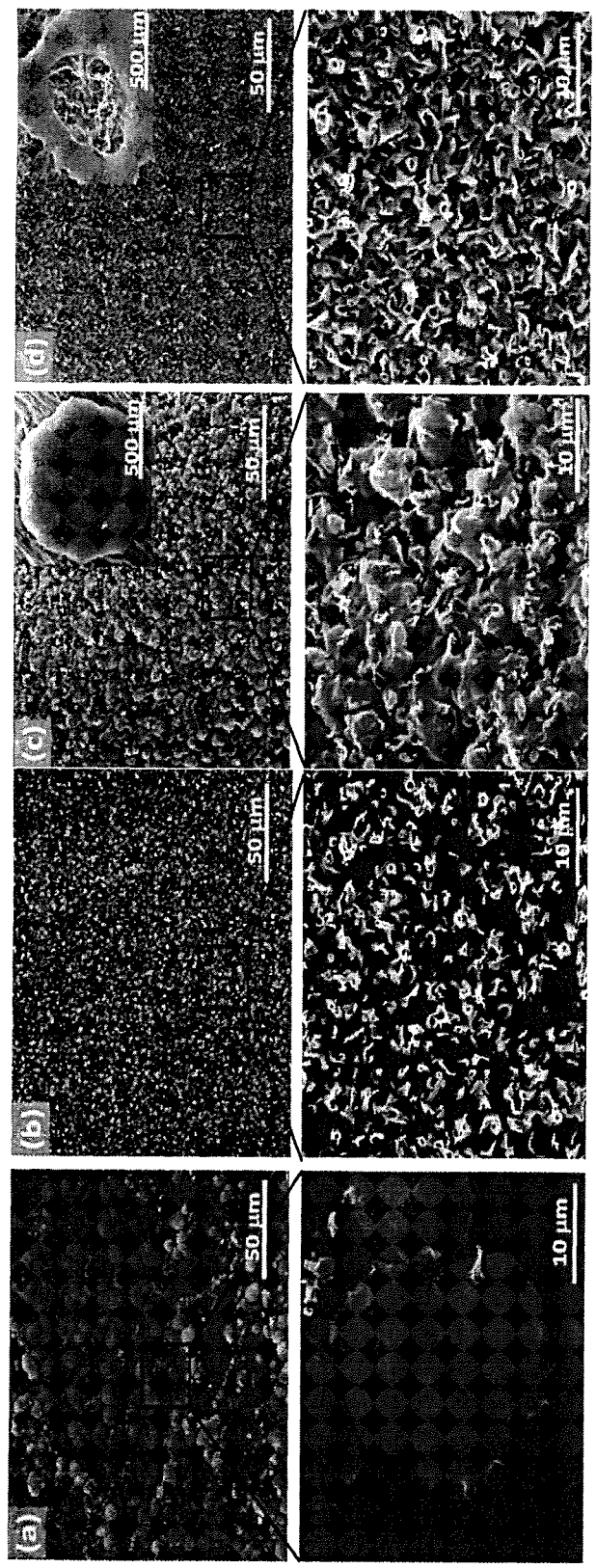

NPs and curved surface were found to be effective internal disturbances contributing to the growth of BCNS structures. As shown in FIG. 2, the addition of NPs can remarkably increase the density of BCNS. Specifically, as shown in FIG. 2A, the pure PEO-PE sol gave rise to only a few BCNS structures but to many pile-like structures, which are probably agglomerates of BCNS. In contrast, many BCNS can be found when NPs were involved in the self-assembly process as shown in FIG. 2B. To further confirm the significance of the NPs to the growth of BCNS, a highly curved surface of the PEO-PE sol and its mixture with MWCNT was generated by a droplet on a superhydrophobic substrate as shown in FIGS. 2C and D. Clearly shown is the fact that NP is a key factor contributing to the BCNS growth. At the same time, a much higher density of BCNS can be observed when one compares the sample with curved surface (FIG. 2D) and the one without (FIG. 2B), indicating that the curved surface promotes BCNS growth.

Figure 3:
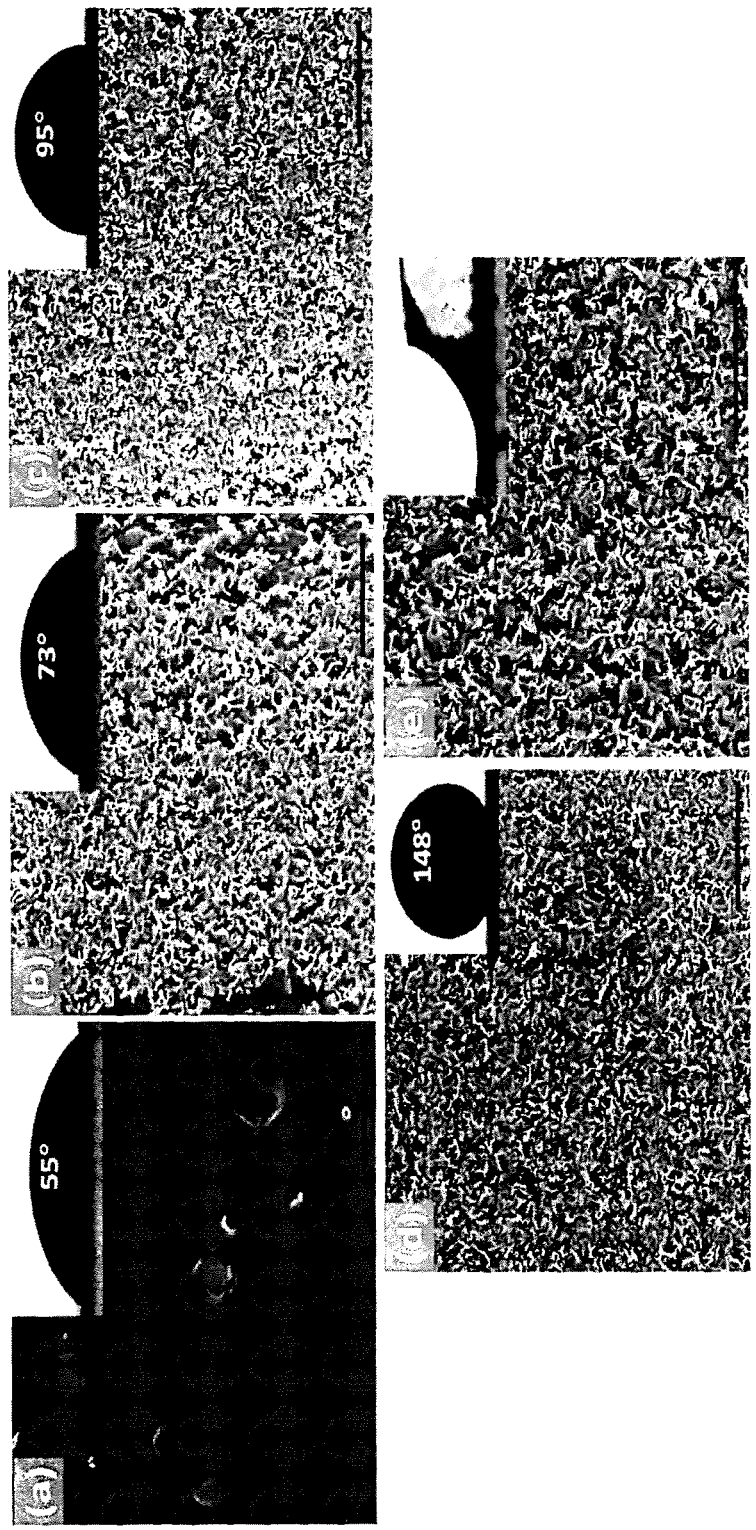
FIG. 3A-E. Curved surface as controlled by various substrates/edges for the growth of BCNS. A-D: SEM images for the dried droplet on Al, PE, PTFE, and superhydrophobic leave, respectively. E, SEM image for the BCNS from a curved surface along an edge line (see the inset). The initial droplets on the substrate with the contact angle values are shown by the insets. Different contact angle represents different curvature. All the liquid is the mixture of PEO-PE sol with multiwalled carbon nanotubes (MWCNT) (weight ratio, PEO-PE/MWCNT=5:1) with overall concentration of 3 wt %. The scale bar represents 20 µm.

It is known that a liquid will form a curved surface as the result of surface tension. In order to further reveal how a curved surface contributes to the growth of BCNS, various substrates were employed to control the curvature of the droplets of the mixture of PEO-PE sol with NPs (for example, MWCNT, unless otherwise indicated). Aluminum (Al), polyethylene (PE), polytetrafluoroethylene (PTFE), and superhydrophobic leaves were used to provide substrates from ranging from hydrophilic (Al) to superhydrophobic (leaf) surfaces as shown by the contact angles in FIG. 3A-D. A curved surface created via boundary/edge effects, as shown in FIG. 3E, was also investigated, and the SEM image also shows a high density of BCNS. From the SEM images, it is distinctly shown that there is a curvature-dependent behavior for the density of the BCNS structures, that is, the larger the curvature or contact angle, the higher the density of BCNS.

Figure 4:
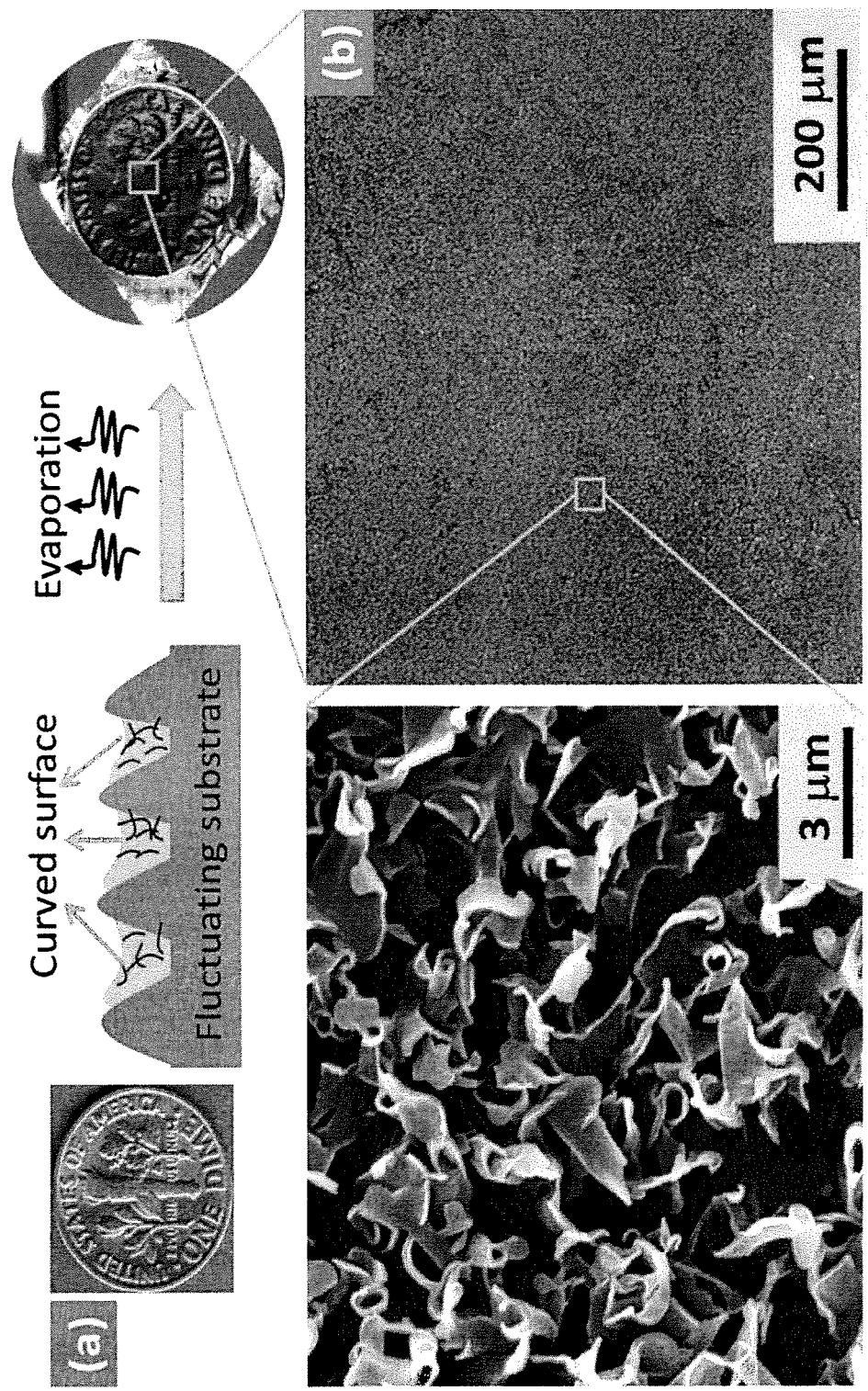
FIGS. 4 and B. A, demonstration of nanofabrication of BCNS via a combination of the effects from NPs (carbon nanofiber, for example) and curved surface. An aluminum substrate copying the fluctuating surface of a coin has been employed. B, SEM images.
Figure 5:
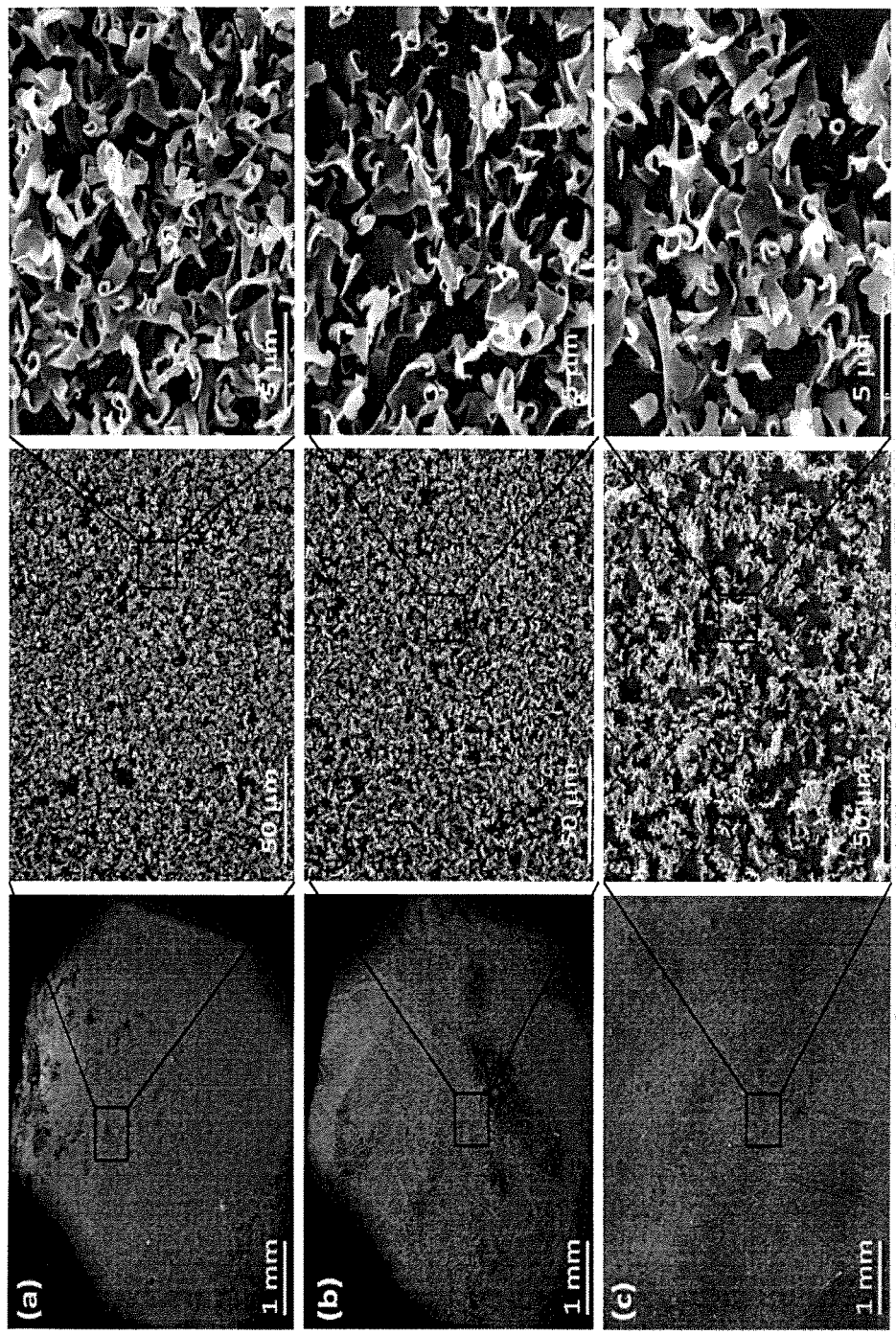
FIG. 5A-C. SEM images of the nanosheet structures from the evaporation of liquid samples with various NPs: A, CNF, B, MWCNT and C, GNP, on a fluctuating surface copied from a coin. By combining contribution from NPs and curved surface, a surface with a high density of nanosheet structures can be easily fabricated.

The above findings are significant as one can easily take advantage of them for fabricating a surface with a high density of nanosheet structures. FIG. 4 shows one example generated with a mixture of CNF and PEO-PE sol. To combine the contributions from NPs and curved surfaces, the mixture was cast on a substrate with many edges and boundaries (see FIG. 4A). The SEM images of the BCNS structures are shown in FIG. 4B. As expected, a high density of BCNS can be observed over almost all the surface area covered by the mixture. Various NPs have been used for this demonstration, and the results are shown in FIG. 5A-C.

Figure 6:
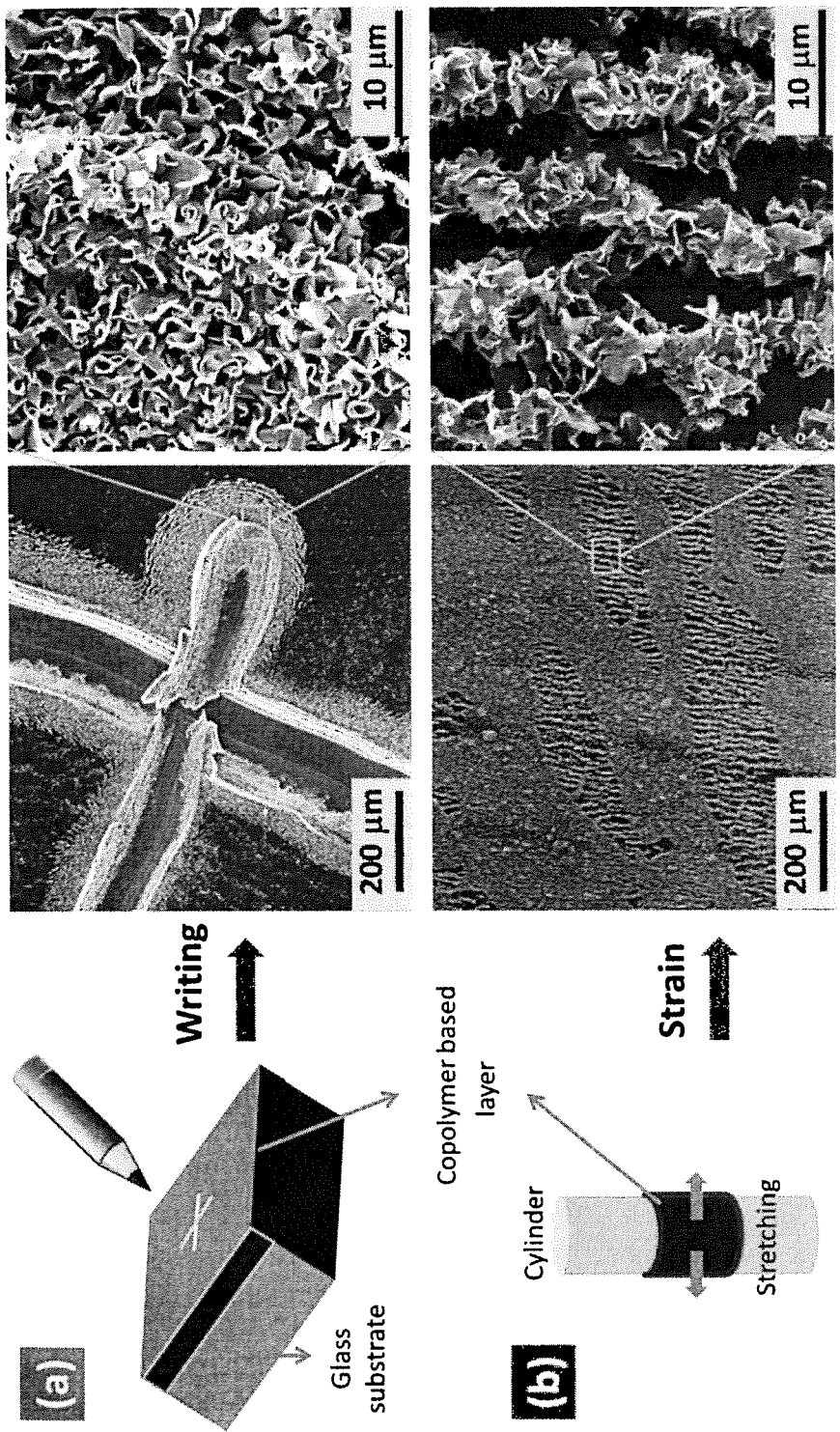
FIGS. 6A and B. BCNS structures obtained by applying deformations to dried PEO-PE/CNF: A, demonstration of BCNS growth by writing, with SEM images showing that the growth of BCNS coincides with the lines produced by writing; B, illustration of BCNS production by strain and the SEM images of the corresponding BCNS. A cylinder with diameter of 1.2 mm is used to perform a controlled deformation (ca. 4% tensile strain of the surface).
Figure 7:
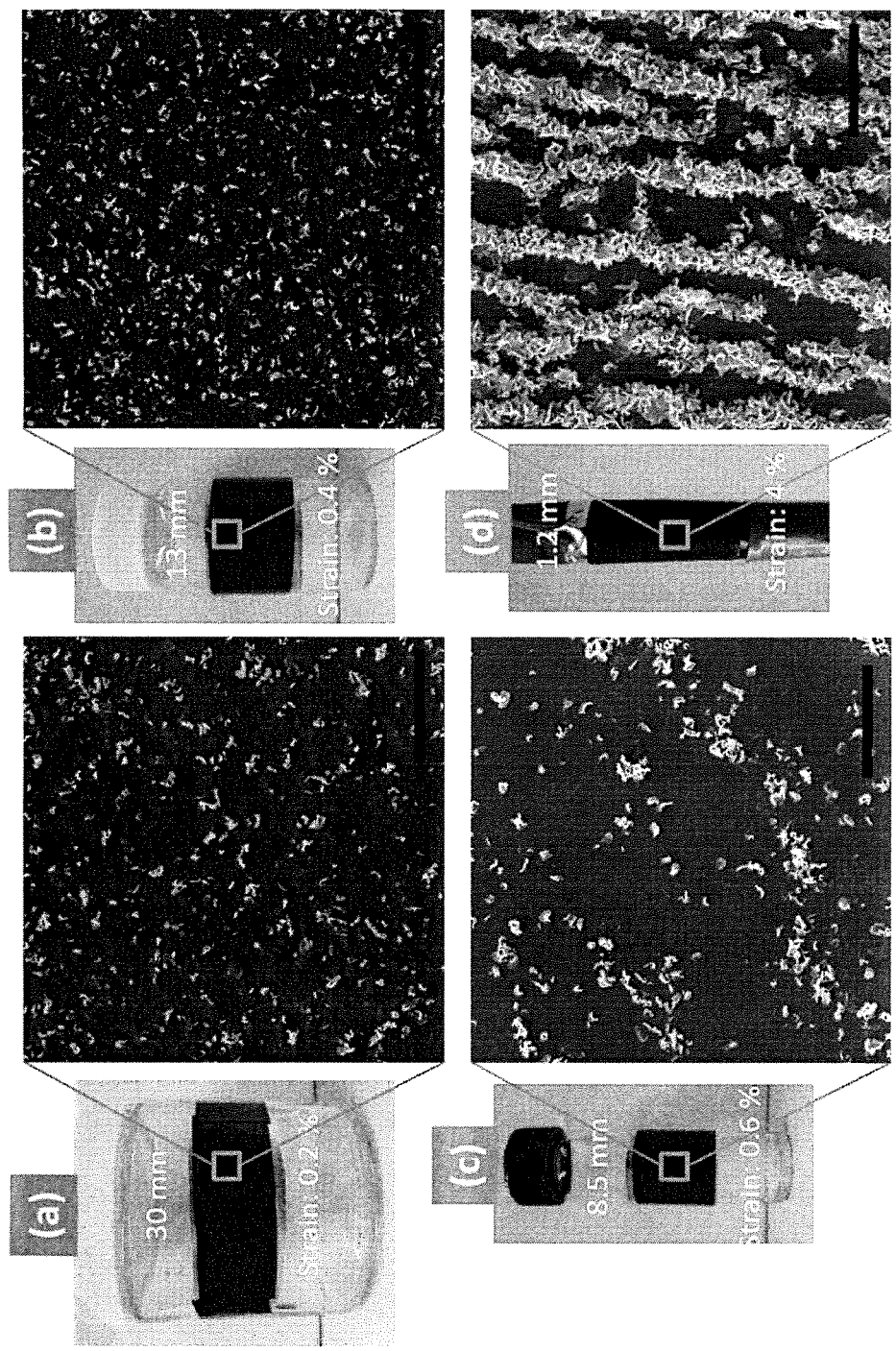
FIG. 7A-D. Demonstration of the effects of deformation on the growth of BCNS via a controllable approach. Cylinders with different diameters were employed to generate an extension strain as shown. A, 30 mm diameter; B, 13 mm; C, 8.5 mm; D, 1.2 mm.
Figure 8:
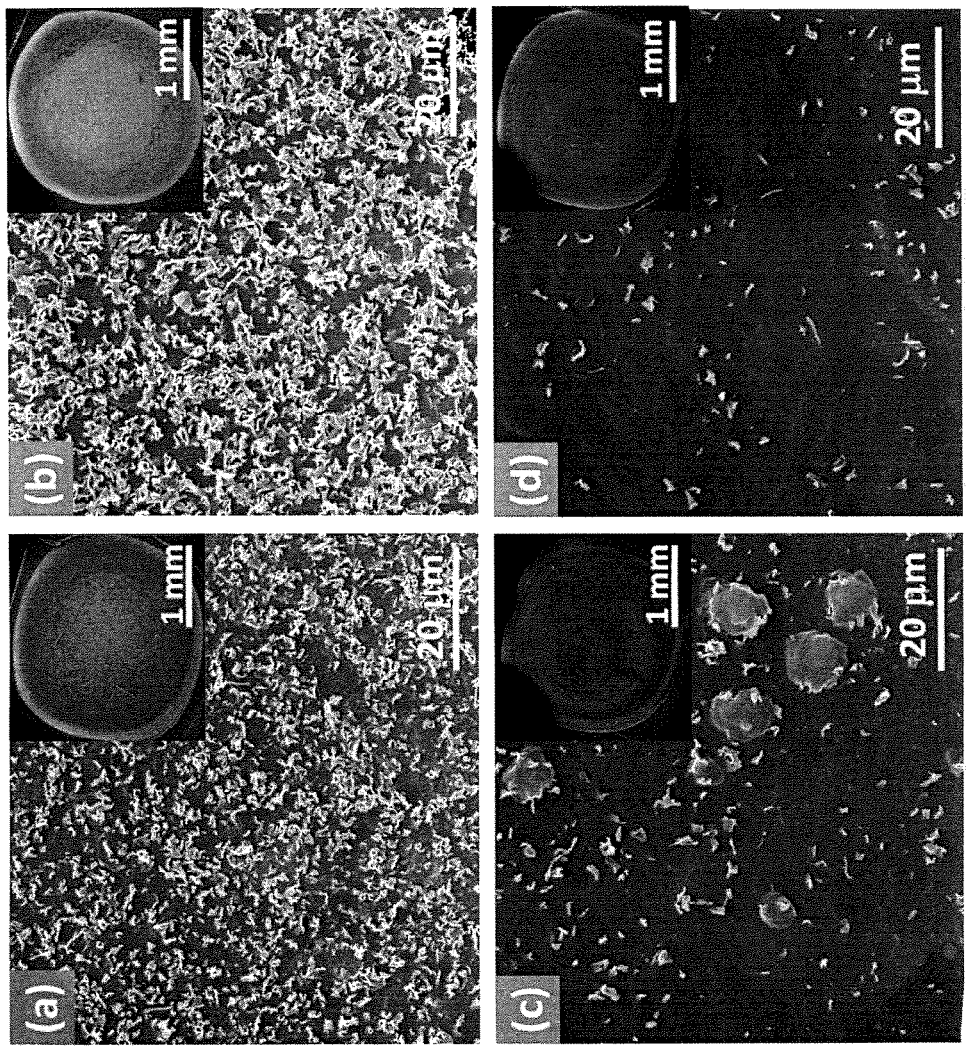
FIG. 8A-D. Effects of evaporation temperature on the growth of BCNS as revealed by a droplet of (PEO-PE/CNF) on PTFE substrate: A, 6° C.; B, 20° C., C, 40° C., and D, 55° C. The inserts show the overview of the dried droplet after 24 h.

Disturbed Self-Assembly by Deformation. Another method to promote the growth of nanosheets is based on the strain sensitivity of BCNS. It was found that BCNS can also be significantly induced by various deformations applied to the dried PEO-PE sol or its mixture with other NPs, such as the strain generated by scratching/writing (FIG. 6A) or the strain resulting from extension (FIG. 6B). From the SEM images in FIG. 6A, one can clearly observe the occurrence of a high density of BCNS along the scratched line, which indicates the sensitivity of BCNS to the strain generated by writing (a shard of glass was employed as the pen). Similarly, extension strain generated by a cylinder has also been found to be effective to induce the generation of highly dense BCNS as shown in FIG. 6B. It is noted that the diameter of the cylinder should be small enough to generate sufficient extension strain and induce the growth of BCNS (see FIG. 7A-D). The diameter of the cylinder shown in FIG. 6B is 1.2 mm, and the corresponding extension strain at the surface is ca. 4%. The orientation of the BCNS structures is likely due to the strain line caused by the extension, which is perpendicular to the direction of extension.

Discussion. We have shown above two simple but significant ways to disturb the self-assembly of BC for the propagation of BCNS structures. The first is the utilization of NPs and a curved surface. It is well-known that amphiphilic block copolymers themselves will form a lamellar structure via self-assembly at high concentrations.[31] Therefore, the BCNS is likely a derivative of lamellar structures formed as a result of disturbances of NPs and/or the presence of a curved surface (i.e. disturbances in surface tension). Without being bound by theory, it is believed that the disturbance due to NPs is determined by interactions between the NPs and PEO-PE nanomicelles and the developing nanostructures. The fact that NPs can be easily dispersed in PEO-PE sol implies that there is a strong interaction between NPs and PEO-PE micelles, which has been confirmed by images (not shown). This strong affinity may not only disturb the self-assembly process of PEO-PE but also can enable the NPs to be nucleation foci for the growth of BCNS. This conjecture is supported by SEM images showing the growth of BCNS along NPs and the penetration of NPs through BNCS (not shown). As a result of the high affinity, the BCNS cannot stack layer-by-layer due to the block effects of NPs and instead form the random network of BCNS observed in the SEM images. However, it is noted that a strong interaction between NPs and PEO-PE may also suppress the growth of BCNS. For example, it was found that NPs (wax particles with PEO-PE as surfactant on the surface) with strong interaction with the PEO block of the PEO-PE gave rise to very few BCNS even under the effects of a curved surface (not shown). One explanation of this finding is that the interaction between NPs and the PEO block of PEO-PE is so strong that they can fundamentally suppress the self-assembly of the copolymer and suppress the growth of BCNS. This explanation was supported, to some extent, by the fact that the addition of lithium salt (ca. 15 wt % relative to PEO-PE) completely suppressed the growth of BCNS (not shown), which is mainly due to the loss of crystallization of PEO-block because of the lithium salt.[59] Therefore, it appears that control of the interaction between NPs and PEO-PE is important for the growth of BCNS.

A curved surface as a result of surface tension as discussed above is another built-in disturbance for the crowding of BCNS. The curvature-dependent behavior of the density of BCNS indicates that surface tension or curvature itself disturbs the self-assembly of PEO-PE. However, it is noted that the effects of curvature on the growth of BCNS were found only when NPs were included in the sol. This finding implies that the disturbance from surface tension or curvature only amplifies the effects of NPs. This point can be understood if one views the surface tension or a curved surface as an additional force to disorganize the assembling of BCNS.

The finding that disturbances to self-assembly by NPs and curved surfaces can strongly facilitate the formation of BCNS is significant for the several reasons. First, this indicates that NPs can be employed to manipulate the self-assembly of copolymers as well as the final nanostructures, which is different from the traditional study focusing on how to construct well-controlled nanostructures of NPs under the aid of the self-assembly of copolymers or surfactants. Second, the addition of NPs can be designed for various functionalizations for applications into sensors, catalytic films, electrodes, and so on. Third, it is extremely easy to generate these disturbances in practical applications and enables nanofabrication in a natural and environmentally friendly way.

It should be pointed out that the whole self-assembly process above was driven by natural evaporation at room temperature (ca. 20° C.), while evaporation rate is also an important factor that should be taken into account to control the growth of BCNS. However, because of the difficulty in maintaining a constant evaporation rate even at a fixed temperature, the effects of evaporation rate on the growth of BCNS were only qualitatively investigated by changing the temperature of evaporation. As shown in FIG. 8A-D, one can clearly find that temperature indeed plays an important role. It seems that a high temperature (a fast evaporation process) can prohibit the formation of BCNS, while a slow evaporation at around room temperature favors BCNS growth. Thus, temperature 1) changes the evaporation rate; and 2) may also make a difference in co-polymer behavior during self-assembly.[38] The temperature (evaporation rate)-dependent behavior of the growth of BCNS may also indicate that the self-assembly process for the formation of BCNS is time dependent.

Disturbances created by NPs and a curved surface may be viewed as internal disturbances of block copolymer self-assembly, and disturbances created by writing or strain can be viewed as external disturbances. The sensitivity of BCNS to strain as demonstrated in FIG. 8 indicates that the lamellar structure formed after the evaporation of water is unstable and can easily be transformed into curved BCNS structures. This process for the growth of BCNS by strain is simple and implies nanofabrication via transformation from one nanostructure (2D lamella) to another nanostructure (3D BCNS). Moreover, the burgeoning of BCNS by writing as shown in FIG. 6A is significant, as it implies a writable nanotechnology based on block copolymer self-assembly, with implications for programmable nanomaterials and nanodevices. At the same time, the growth of BCNS by a controlled extension (FIG. 6B and FIG. 7A-D) also implies a very simple but powerful approach to scalable and directed fabrication of nanomaterials.

Figure 9:
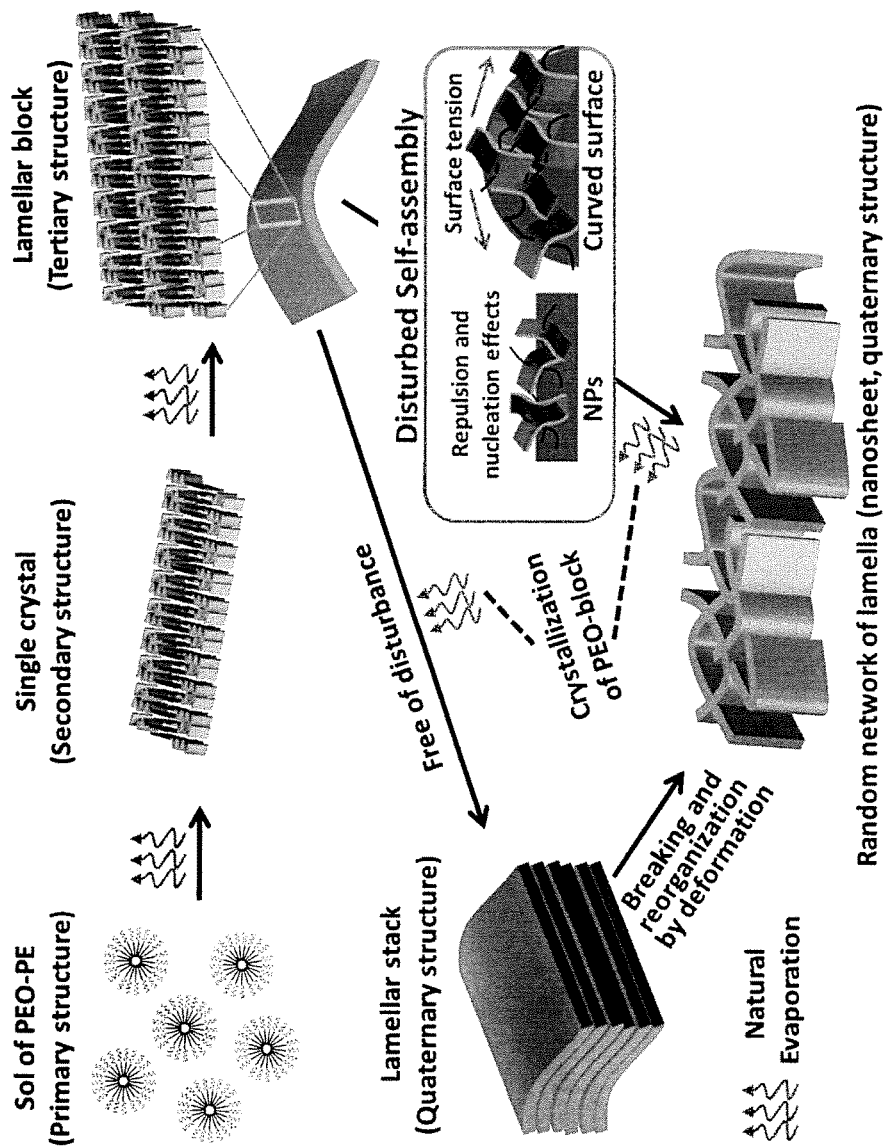
FIG. 9. Illustration of the mechanism for the growth of BCNS via disturbed self-assembly. A physical hierarchical model similar to that of proteins is proposed (for details, see the text).

On the basis of the analysis above, a hierarchical model (similar to that of protein) has been proposed to help the understanding of the possible mechanism for the growing of BCNS via a disturbed self-assembly. Without being bound by theory, as illustrated in FIG. 9, the primary structure is likely the spherical PEO-PE nanomicelle. At the early stages of evaporation, the micelles form a single crystal of PE block, which can be viewed as the secondary structure of the PEO-PE assembly. As evaporation proceeds, lamellar blocks are generated by the self-assembly of the single crystals. At this stage, NPs, if involved, will be combined into a lamellar block, forming a composite lamella that represents the tertiary structure of PEO-PE assembly. During this stage, NPs may also play the role of nucleation foci for the formation of the lamellar blocks. At the last stage, the lamellar blocks start to stack on each other, driven by continuous evaporation and hydrophobic-hydrophilic interactions. If there is no disturbance during this process, the lamellar blocks tend to form bigger lamellar blocks or agglomerates (the quaternary structure). However, if there is a disturbance, e.g. such as NPs and curved surface (surface tension), the disturbance disorganizes the stack process and results in a random network of lamellar blocks, that is, the BCNS structures (another form of quaternary structure). It is noted that, at this stage, the PEO block crystallizes due to the final evaporation of water. Therefore, the crystallization of PEO-block likely contributes to solidification and the transformation to randomly curved BCNS. If deformations have been exerted on the lamellar blocks during or after the last stage, the stacking of lamellar blocks will be disorganized or the existing big lamellar blocks will be broken, also giving rise to high density of BCNS structures.

Conclusions. In summary, we have conclusively shown that polymeric nanosheet structures can be effectively induced by introducing disturbances (from such as NPs, curved surface, and deformations) to the self-assembly of the block copolymer. The disturbed self-assembly shown above may open a door for new nanofabrication techniques based on the self-assembly under controllable disturbances.

Experimental Details. Sample Preparation. (1) Liquid sample. PEO-PE sol was prepared by dispersing PEO-PE (Mn=920 g/mol, 50 wt % PEO-block, Sigma-Aldrich) in DI water at 95° C. for 15 min. The overall concentration of PEO-PE in DI water was 3 wt %. After a gel-sol transition at 95° C., the high temperature sol was cooled down to room temperature while stirring for around 20 min. For the mixture of PEO-PE sol and NPs, various NPs were dispersed in the PEO-PE sol by ultrasonication (5 min, room temperature) with a constant nanofibers (CNFs; diameter, 60-150 nm; length, 30-100 μm; Applied Science, Inc.), MWCNTs (average diameter, 6 nm; length, 5-30 μm; Catalytic Materials, LLC), graphitic nanoplatelets (GNPs; average diameter, 5 μm; average thickness, 5 nm; XG Science, Inc.), and wax particles (ca. 600 nm, PEO-PE as the surfactant).

(2) Substrate preparation. Various substrates were used in this study. A smooth glass slide was used as a flat substrate to create a flat surface for the evaporation. To create a macro-edge on a substrate, a piece of tape was attached to a flat glass slide. To prepare a substrate with a fluctuating surface (lots of edges and boundaries), aluminum foil was employed to copy the patterned surface of a coin (dime). To study how deformation contributes to the growth of BCNS, a piece of tape was used as the substrate and then the dried sample was fixed on the surface of cylinders with different diameters. Plant leaves with superhydrophobic properties were employed as the substrate to create a nearly spherical liquid surface. All materials were cleaned by ultrasonic treatment in ethanol before they were used as the substrate for evaporation.

(3) Evaporation. The liquid sample was dropped or cast onto the substrate and evaporated at room temperature for 24 h.

(4) To demonstrate the sensitivity of BCNS to deformation, two kinds of samples were used: the first type consists of samples with dried PEO-PE/CNF on a glass substrate, on which cross lines were drawn by a glass tip; the second type is a group of samples with PEO-PE/CNF cast onto a tape. For the second one, a constant extension strain was obtained by rolling the tape around a cylinder.

Characterizations. Particle sizes of the PEO-PE micelles in the sol were determined by dynamic light scattering (ZetasizerNano S90, Malvern), and the particle size result is the average of 10 measurements. At the same time, the PEO-PE micelle particles were also characterized by scanning electronic microscopy (SEM). Differential scanning calorimetry (DSC) was used to determine the melting points of the two blocks in the copolymer PEO-PE. A heating rate of 10° C./min and a temperature range from 25 to 150° C. were used to obtain DSC melting curves. All nanostructures were characterized by SEM.

REFERENCES (1) Turek, V. A.; Elliott, L. N.; Tyler, A. I. I.; Demetriadou, A.; Paget, J.; Cecchini, M. P.; Kucernak, A. R.; Kornyshev, A. A.; Edel, J. B. ACS Nano 2013, 7 (10), 8753-8759.
(2) Nakano, T.; Kawaguchi, D.; Matsushita, Y. J. Am. Chem. Soc. 2013, 135 (18), 6798-6801.
(3) Lee, K.; Wagermaier, W.; Masic, A.; Kommareddy, K. P.; Bennet, M.; Manjubala, I.; Lee, S. W.; Park, S. B.; Colfen, H.; Fratzl, P. Nat. Commun. 2012, 3, 725-727.
(4) Naqshbandi, M.; Canning, J.; Gibson, B. C.; Nash, M. M.; Crossley, M. J. Nat. Commun. 2012, 3, 1188-1195.
(5) Simon, U. Nat. Mater. 2013, 12 (8), 694-696.
(6) Jung, Y. S.; Lee, J. H.; Lee, J. Y.; Ross, C. A. Nano Lett. 2010, 10 (9), 3722-3726.
(7) Warren, S. C.; Messina, L. C.; Slaughter, L. S.; Kamperman, M.; Zhou, Q.; Gruner, S. M.; DiSalvo, F. J.; Wiesner, U. Science 2008, 320 (5884), 1748-1752.
(8) Jung, Y. S.; Chang, J. B.; Verploegen, E.; Berggren, K. K.; Ross, C. A. Nano Lett. 2010, 10 (3), 1000-1005.
(9) Segalman, R. A. Science 2008, 321 (5891), 919-920.
(10) Arora, H.; Du, P.; Tan, K. W.; Hyun, J. K.; Grazul, J.; Xin, H. L.; Muller, D. A.; Thompson, M. O.; Wiesner, U. Science 2010, 330 (6001), 214-219.
(11) Jung, Y. S.; Jung, W.; Ross, C. A. Nano Lett. 2008, 8 (9), 2975-2981.
(12) Kim, S. O.; Solak, H. H.; Stoykovich, M. P.; Ferrier, N. J.; de Pablo, J. J.; Nealey, P. F. Nature 2003, 424 (6947), 411-414.
(13) Jung, Y. S.; Jung, W.; Tuller, H. L.; Ross, C. A. Nano Lett. 2008, 8 (11), 3776-3780.
(14) Choi, J.; Hermans, T. M.; Lohmeijer, B. G. G.; Pratt, R. C.; Dubois, G.; Frommer, J.; Waymouth, R. M.; Hedrick, J. L. Nano Lett. 2006, 6 (8), 1761-1764.
(15) Jeong, J. W.; Park, W. I.; Kim, M. J.; Ross, C. A.; Jung, Y. S. Nano Lett. 2011, 11 (10), 4095-4101.
(16) Percec, V.; Wilson, D. A.; Leowanawat, P.; Wilson, C. J.; Hughes, A. D.; Kaucher, M. S.; Hammer, D. A.; Levine, D. H.; Kim, A. J.; Bates, F. S.; Davis, K. P.; Lodge, T. P.; Klein, M. L.; DeVane, R. H.; Aqad, E.; Rosen, B. M.; Argintaru, A. O.; Sienkowska, M. J.; Rissanen, K.; Nummelin, S.; Ropponen, J. Science 2010, 328 (5981), 1009-1014.
(17) Discher, B. M.; Won, Y. Y.; Ege, D. S.; Lee, J. C. M.; Bates, F. S.; Discher, D. E.; Hammer, D. A. Science 1999, 284 (5417), 1143-1146.
(18) Shen, H. W.; Eisenberg, A. Angew. Chem., Int. Ed. 2000, 39 (18), 3448-3450.
(19) Ho, R. M.; Chiang, Y. W.; Lin, S. C.; Chen, C. K. Prog. Polym. Sci. 2011, 36 (3), 376-453.
(20) Sai, H.; Tan, K. W.; Hur, K.; Asenath-Smith, E.; Hoyden, R.; Jiang, Y.; Riccio, M.; Muller, D. A.; Elser, V.; Estroff, L. A.; Gruner, S. M.; Wiesner, U. Science 2013, 341 (6145), 530-534.
(21) Li, Z.; Ding, J. F.; Day, M.; Tao, Y. Macromolecules 2006, 39 (7), 2629-2636.
(22) Rowan, S. J. Nat. Mater. 2009, 8 (2), 89-91.
(23) Pizarro, G. D.; Marambio, O. G.; Jeria-Orell, M.; Valdes, D. T.; Geckeler, K. E. Polym. Int. 2013, 62 (10), 1528-1538.
(24) Bhargava, P.; Zheng, J. X.; Li, P.; Quirk, R. P.; Harris, F. W.; Cheng, S. Z. D. Macromolecules 2006, 39 (14), 4880-4888.
(25) Sun, L.; Liu, Y. X.; Zhu, L.; Hsiao, B. S.; Avila-Orta, C. A. Polymer 2004, 45 (24), 8181-8193.
(26) Tyrrell, Z. L.; Shen, Y. Q.; Radosz, M. Prog. Polym. Sci. 2010, 35(9), 1128-1143.
(27) Harada, A.; Kataoka, K. Prog. Polym. Sci. 2006, 31 (11), 949-982.
(28) Nishiyama, N. Nat. Nanotechnol. 2007, 2 (4), 203-204. Nano Letters Letter 3479 dx.doi.org/10.1021/nl501002fl Nano Lett. 2014, 14, 3474-3480
(29) Stoykovich, M. P.; Muller, M.; Kim, S. O.; Solak, H. H.; Edwards, E. W.; de Pablo, J. J.; Nealey, P. F. Science 2005, 308 (5727), 1442-1446.
(30) Yao, L.; Woll, A. R.; Watkins, J. J. Macromolecules 2013, 46 (15), 6132-6144.
(31) Xu, J.; Park, S.; Wang, S. L.; Russell, T. P.; Ocko, B. M.; Checco, A. Adv. Mater. 2010, 22 (20), 2268-2272.
(32) Tada, Y.; Akasaka, S.; Yoshida, H.; Hasegawa, H.; Dobisz, E.; Kercher, D.; Takenaka, M. Macromolecules 2008, 41 (23), 9267-9276.
(33) Mendoza, C.; Pietsch, T.; Gindy, N.; Fahmi, A. Adv. Mater. 2008, 20 (6), 1179-1184.
(34) Gotrik, K. W.; Ross, C. A. Nano Left. 2013, 13 (11), 5117-5122.
(35) Jung, Y. S.; Ross, C. A. Nano Lett. 2007, 7 (7), 2046-2050.
(36) Singh, G.; Yager, K. G.; Berry, B.; Kim, H. C.; Karim, A. ACS Nano 2012, 6 (11), 10335-10342.
(37) Brezesinski, T.; Groenewolt, M.; Gibaud, A.; Pinna, N.; Antonietti, M.; Smarsly, B. M. Adv. Mater. 2006, 18 (17), 2260-2263.

(38) Brinker, C. J.; Lu, Y. F.; Sellinger, A.; Fan, H. Y. Adv. Mater. 1999, 11 (7), 579-585.
(39) Hong, S. W.; Byun, M.; Lin, Z. Q. Angew. Chem., Int. Ed. 2009, 48 (3), 512-516.
(40) Han, W.; Byun, M.; Lin, Z. Q. J. Mater. Chem. 2011, 21 (42), 16968-16972.
(41) Kwon, S. W.; Byun, M.; Yoon, D. H.; Park, J. H.; Kim, W. K.; Lin, Z. Q.; Yang, W. S. J. Mater. Chem. 2011, 21 (14), 5230-5233.
(42) Byun, M.; Bowden, N. B.; Lin, Z. Q. Nano Lett. 2010, 10 (8), 3111-3117.
(43) Byun, M.; Han, W.; Qiu, F.; Bowden, N. B.; Lin, Z. Q. Small 2010, 6 (20), 2250-2255.
(44) Liu, S. Y.; Weaver, J. V. M.; Tang, Y. Q.; Billingham, N. C.; Armes, S. P.; Tribe, K. Macromolecules 2002, 35 (16), 6121-6131.
(45) Zhang, S. Y.; Prud'homme, R. K.; Link, A. J. Nano Lett. 2011, 11 (4), 1723-1726.
(46) Lee, J. W.; Lee, C.; Choi, S. Y.; Kim, S. H. Macromolecules 2010, 43 (1), 442-447.
(47) Ikkala, O.; ten Brinke, G. Science 2002, 295 (5564), 2407-2409.
(48) Lin, Y.; Boker, A.; He, J. B.; Sill, K.; Xiang, H. Q.; Abetz, C.; Li, X. F.; Wang, J.; Emrick, T.; Long, S.; Wang, Q.; Balazs, A.; Russell, T. P. Nature 2005, 434 (7029), 55-59.
(49) Haryono, A.; Binder, W. H. Small 2006, 2 (5), 600-611.
(50) Matsen, M. W.; Thompson, R. B. Macromolecules 2008, 41 (5), 1853-1860.
(51) Lazzari, M.; Lopez-Quintela, M. A. Adv. Mater. 2003, 15 (19), 1583-1594.
(52) Oss-Ronen, L.; Schmidt, J.; Abetz, V.; Radulescu, A.; Cohen, Y.; Talmon, Y. Macromolecules 2012, 45 (24), 9631-9642.
(53) Deng, R. H.; Liu, S. Q.; Li, J. Y.; Liao, Y. G.; Tao, J.; Zhu, J. T. Adv. Mater. 2012, 24 (14), 1889-1893.
(54) Pietsch, T.; Gindy, N.; Fahmi, A. Soft Matter 2009, 5 (11), 2188-2197.
(55) Lu, Y. F.; Ganguli, R.; Drewien, C. A.; Anderson, M. T.; Brinker, C. J.; Gong, W. L.; Guo, Y. X.; Soyez, H.; Dunn, B.; Huang, M. H; Zink, J. I. Nature 1997, 389 (6649), 364-368.
(56) Freer, E. M.; Krupp, L. E.; Hinsberg, W. D.; Rice, P. M.; Hedrick, J. L.; Cha, J. N.; Miller, R. D.; Kim, H. C. Nano Lett. 2005, 5 (10), 2014-2018.
(57) Luchnikov, V.; Kondyurin, A.; Formanek, P.; Lichte, H.; Stamm, M. Nano Lett. 2007, 7 (12), 3628-3632.
(58) Ruzette, A. V.; Leibler, L. Nat. Mater. 2005, 4 (1), 19-31.
(59) Wang, Y.; Li, B.; Ji, J. Y.; Zhong, W. H. J. Power Sources 2014, 247, 452-459. Nano While the invention has been described in terms of its preferred embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

For all numeric ranges provided herein, it should be understood that the ranges include all integers between the highest and lowest value of the range, as well as all decimal fractions lying between those values, e.g. in increments of 0.1.

For all numeric values provided herein, the value is intended to encompass all statistically significant values surrounding the numeric value.

We claim:

1. A method of making solid state block copolymer nanostructures, comprising depositing a block copolymer sol on a substrate;
   evaporating liquid from said block copolymer sol to form a semi-solid;
   physically modifying the surface of the semi-solid; and
   evaporating liquid from the semi-solid, wherein the step of evaporating liquid from the semi-solid causes spontaneous assembly of the three-dimensional co-polymeric nanostructures at or near the site of physical modification.

2. The method of claim 1, wherein the step of physically modifying is performed by scoring or etching the surface of the semi-solid.

3. The method of claim 1 wherein said block copolymer is a bi-block copolymer or a tri-block copolymer.

4. The method of claim 3, wherein said bi-block copolymer is selected from the group consisting of polyethylene-block-poly(ethylene glycol), polylactide-block-poly(ethylene glycol), and polystyrene-block-poly(acrylic acid); and said tri-block copolymer is selected from the group consisting of polylactide-block-poly(ethylene glycol)-block-polylactide and poly(ethylene glycol)-block-poly(propylene glycol)-block-poly(ethylene glycol).

5. The method of claim 1, wherein said solid state block copolymer nanostructure is or includes one or more of a nanosheet, a nanoribbon and a nanotube.

* * * * *